US005872485A

United States Patent [19]

Ishikawa et al.

[11] Patent Number: 5,872,485

[45] Date of Patent: Feb. 16, 1999

[54] DIELECTRIC LINE WAVEGUIDE WHICH FORMS ELECTRONIC CIRCUITS

[75] Inventors: Yohei Ishikawa, Kyoto; Koichi Sakamoto, Otsu; Sadao Yamashita, Kyoto; Takehisa Kajikawa, Osaka, all of Japan

[73] Assignee: Murata Manufacturing Co., Ltd., Japan

[21] Appl. No.: 901,149

[22] Filed: Jul. 28, 1997

[30] Foreign Application Priority Data

Jul. 26, 1996 [JP] Japan .................................... 8-197641

[51] Int. Cl.[6] ................................ H03F 3/60; H04B 1/26; H03B 5/12; H01P 5/00

[52] U.S. Cl. .................................... 330/286; 331/107 DP; 333/247; 333/250; 455/325

[58] Field of Search ..................................... 333/247, 248, 333/250; 330/277, 286; 331/107 DP, 107 SL; 455/325, 326, 327

[56] References Cited

U.S. PATENT DOCUMENTS

| | | | |
|---|---|---|---|
| 4,188,584 | 2/1980 | Hoogstraate | 455/328 |
| 4,587,541 | 5/1986 | Dalman et al. | 333/247 X |
| 4,864,645 | 9/1989 | Dixon, Jr. et al. | 333/247 X |
| 5,736,908 | 4/1998 | Alexanian et al. | 330/286 X |
| 5,770,989 | 6/1998 | Ishikawa et al. | 331/107 DP X |

FOREIGN PATENT DOCUMENTS

| | | |
|---|---|---|
| 1438149 | 6/1976 | United Kingdom . |

OTHER PUBLICATIONS

Artuzi, et al., "A HEMT Amplifier for Nonradiative Dielectic Waveguide Integrated Circuits", IEICE Tractions, vol. E 74, No. 5, May 1991.

Tsukasa Yoneyama, "Millimeter–Wave Integrated Circuits Using Nonradiative Dielectric Waveguide", *Electronics & Communications In Japan, Part II—Electronics,* vol. 4, No. 2, Feb. 1, 1991, pp. 20–28.

S.J. Nightingale, et al., "A 30 GHz Monolithic Single–Balanced Mixer with Integrated Dipole Receiving Element", *Microwave Journal,* vol. 28, No. 8 Aug. 1985, pp. 103–116.

*Primary Examiner*—Paul Gensler
*Attorney, Agent, or Firm*—Ostrolenk, Faber, Gerb & Soffen, LLP

[57] ABSTRACT

An amplifying circuit is formed by a combination of a dielectric line waveguide and a semiconductor device. Two electrically conductive plates are provided substantially parallel to each other. Two dielectric strips are disposed between the two conductive plates, and a dielectric plate is further inserted between the dielectric strips. Ground conductors are formed on the dielectric plate. The ground conductors have an area which equals an amount required for blocking a RF signal propagating in the dielectric line waveguide. A slot line is formed between the ground conductors in a position intermediate opposed sides of the dielectric strips. Line-switching conductor patterns are provided at both sides of the ends of the slot line. A field-effect transistor is mounted on the slot line such that it bridges over the slot line. Accordingly, losses and distortion of an RF signal, which would occur in an input/output circuit, are suppressed, and the generation of parasitic coupling is eliminated. Further, the dielectric line waveguide is miniaturized free from an external circuit, and accordingly, the manufacturing cost is reduced as well.

19 Claims, 7 Drawing Sheets

DIELECTRIC LINE WAVEGUIDE WHICH FORMS ELECTRONIC CIRCUITS

BACKGROUND OF THE INVENTION

1. Field of the Invention

The present invention relates to a dielectric line waveguide which forms an amplifying circuit or a modulation circuit, used in, for example, a circuit module in a millimetric wave or microwave band.

2. Description of the Related Art

Hitherto, a dielectric line waveguide has been used as a communication module in a millimetric wave band. In particular, a nonradiative dielectric line waveguide (NRD guide) is free from radiation losses and can be miniaturized due to its configuration such that a dielectric strip is inserted between two plane-parallel plates having an interval of a half-wave length or less. Thus, research is being made on applications of the NRD guides to millimetric-wave integrated circuits. An example of applications of the above type of dielectric line waveguide to an amplifying circuit is shown in *HEMT Amplifier Used in NRD Guide Integrated Circuit*, by Wilkinson, A. A, and Tsutomu Yoneyama, The 1990 IEICE Spring Conference, SC-2-2, (1990) pp. 2–627.

In an amplifying circuit formed by a combination of a dielectric line waveguide and a semiconductor device, as shown in the above example, the semiconductor device is conventionally disposed outside the dielectric line waveguide. Accordingly, a signal propagating in the dielectric line waveguide is first output from the waveguide and is then processed in the semiconductor device, and is once again returned to the dielectric line waveguide.

When a frequency signal (RF signal) is input into or output from a semiconductor device, impedance matching should be, in general, performed in an input/output circuit provided between a transmission line and the semiconductor device in order to improve input/output efficiency. However, the foregoing amplifying circuit in which the semiconductor device is provided on the exterior of the dielectric line waveguide encounters the following problems. Loss and distortion may be incurred in the RF signal while impedance matching is performed in the input/output circuit, such as a matching circuit, and parasitic coupling is easily generated between an external circuit, such as a semiconductor device, and the dielectric line waveguide, thereby degrading the RF characteristics. Further, the configuration of the circuit is complicated, which inevitably makes the manufacturing process very complicated as well.

SUMMARY OF THE INVENTION

Accordingly, it is an object of the present invention to provide a dielectric line waveguide free from the above-described problems, such as loss and distortion incurred in RF signals in an input/output circuit, and parasitic coupling generated between an external circuit and the dielectric line waveguide, in which miniaturization of the dielectric line waveguide can be enhanced free from external circuits, and the manufacturing cost can be reduced accordingly.

In order to achieve the above object, according to the present invention, there is provided a dielectric line waveguide comprising: two electrically conductive plates disposed substantially parallel to each other; a dielectric strip disposed between the two electrically conductive plates; a dielectric plate disposed between the two electrically conductive plates; a ground conductor formed on the dielectric plate and having an area which equals an amount required for blocking a frequency signal propagating in the dielectric line waveguide, the ground conductor having a slot line at a position intermediate opposed sides of the dielectric strip; a line-switching conductor pattern provided for the ground conductor at a position corresponding to an end of the slot line, the conductor pattern being coupled to electromagnetic fields generated in the slot line and in the dielectric strip; and a semiconductor device disposed on the slot line in such a manner that it bridges over the slot line.

With this arrangement, a longitudinal section magnetic (LSM)-mode RF signal propagating in the dielectric strip is coupled to the line-switching conductor pattern and is converted into a TE-mode signal. The TE-mode signal further propagates in the slot line and is input into the semiconductor device. Conversely, a TE-mode signal output from the semiconductor device propagates in the slot line and is converted into a LSM-mode RF signal via the line-switching conductor pattern provided at an end of the slot line. The LSM-mode RF signal further propagates in the dielectric strip. Accordingly, a circuit formed of a semiconductor device is formed on the dielectric plate at a position corresponding to the inside of the dielectric strip. This eliminates the generation of parasitic coupling between the dielectric line waveguide and an external circuit, which would otherwise be caused if an external circuit is provided. Also, transmission losses generated at a connecting portion between the dielectric strip and the semiconductor device can be inhibited to a minimal level. Moreover, it is possible to fabricate the ground conductor and the line-switching conductor pattern on the dielectric plate according to a technique similar to the typical manufacturing method for a printed wiring board. The manufacturing cost can thus be reduced.

In the above dielectric line waveguide, the line-switching conductor patterns may be respectively provided in positions at both sides of an end of the slot line, and the semiconductor device may be disposed substantially at the center of the slot line. Thus, a frequency signal (RF signal) propagating in the dielectric line waveguide is interrupted in and by the action of the ground conductor disposed on the dielectric plate. Accordingly, two dielectric lines are formed in a continuous dielectric strip, and are connected to each other via the semiconductor device. It is thus possible to readily construct a dielectric line waveguide provided with an amplifying circuit by using, for example, a FET.

Further, in the above dielectric line waveguide, a $\lambda/4$ short stub used for providing impedance matching between the line-switching conductor pattern and the semiconductor device may be provided in the slot line. This achieves impedance matching between the line-switching conductor pattern and the semiconductor device, thereby inhibiting transmission losses at a connecting portion between the slot line and the semiconductor device.

Additionally, in the above dielectric line waveguide, an impedance matching circuit may be provided between the line-switching conductor pattern and the slot line. This realizes the impedance matching between the slot line and the line-switching conductor pattern and between the slot line and the dielectric line waveguide. It is thus possible to suppress unwanted reflection, and inhibit transmission losses incident to a line-switching operation.

DESCRIPTION OF THE PREFERRED EMBODIMENTS

A description will now be given with reference to FIGS. 1 through 3 of the configuration of a dielectric line waveguide provided with an amplifying circuit according to a first embodiment of the present invention.

Figure 1A:
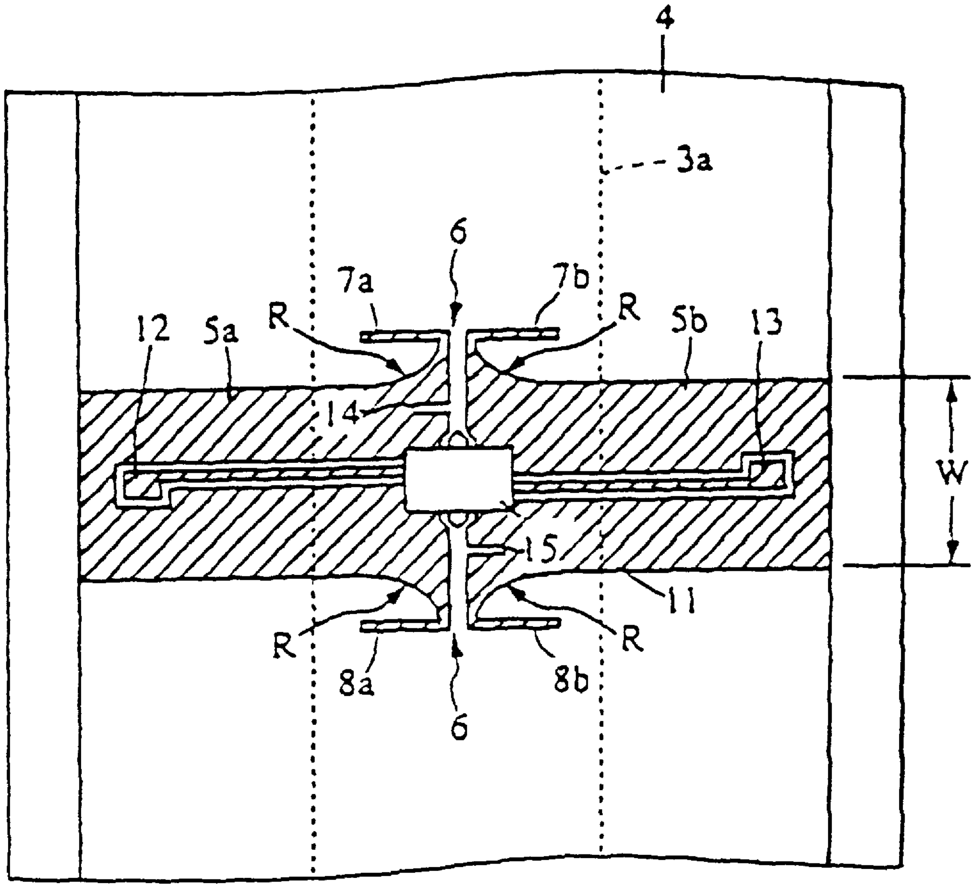
FIG. 1, which is comprised of FIGS. 1A and 1B, illustrates the configuration of a dielectric line waveguide provided with an oscillator circuit according to a first embodiment of the present invention.
Figure 1B:
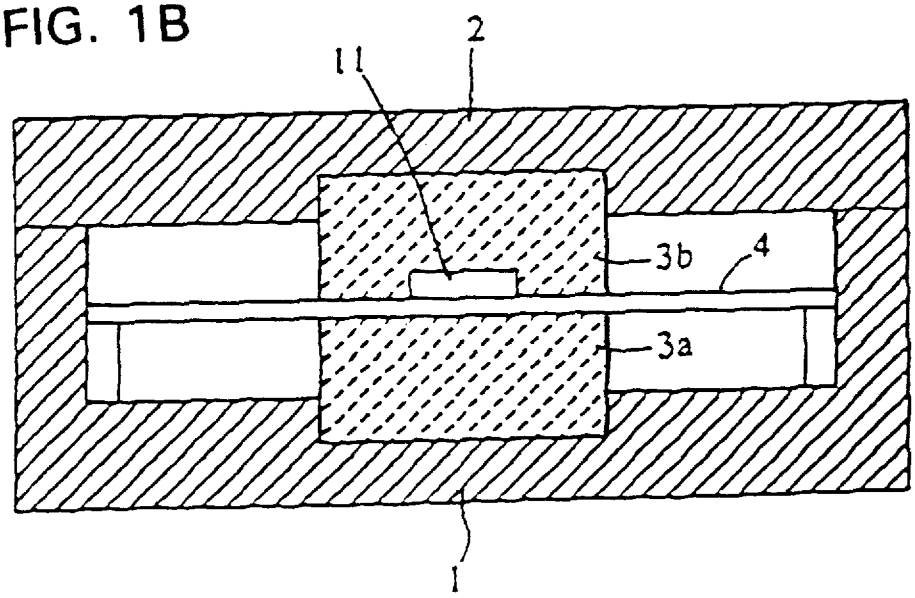

FIG. 1 illustrates the major configuration of the dielectric line waveguide: FIG. 1A is a plan view illustrating the dielectric line waveguide from which an upper electrically conductive plate and an upper dielectric strip are removed; FIG. 1B is a sectional view of the dielectric line waveguide shown in FIG. 1A. In this embodiment, as illustrated in FIG. 1B, two electrically conductive plates 1 and 2, which form two plane parallel conductors, are grooved. Then, dielectric strips 3*a* and 3*b* are fit into the respective grooves, and a dielectric plate 4 is inserted between the dielectric strips 3*a* and 3*b*. An NRD guide (hereinafter simply referred to as a "dielectric line waveguide") is thus constructed. Formed on the upper surface of the dielectric plate 4 are, as shown in FIG. 1A, ground conductors 5*a* and 5*b* having a width W which equals an amount required for blocking an RF signal propagating in the dielectric line waveguide. For example, the width of the ground conductors 5*a* and 5*b* should be 1 mm or longer in a 60 GHz-band dielectric line waveguide. A slot line 6 is interposed between the opposing ground conductors 5*a* and 5*b* in a direction along the center axis of the dielectric strips 3*a* and 3*b*. The width of the slot line 6 is determined by the required characteristic impedance of a dielectric line waveguide to be designed. For example, a slot line 6 having a width of 0.05 to 0.5 mm makes it possible to obtain the characteristic impedance having 120 to 300 Ω of a resulting dielectric line waveguide. Disposed at both sides of the respective ends of the slot line 6 are line-switching conductor patterns 7*a*, 7*b*, 8*a* and 8*b*, which serve as connecting portions for smoothly guiding a signal propagating in the dielectric strips 3*a* and 3*b* to the slot line 6, and which are coupled to electromagnetic fields generated in the dielectric strips 3*a* and 3*b* of the dielectric line waveguide and electromagnetic fields generated in the slot line 6. In this embodiment, the line-switching conductor patterns 7*a* through 8*b* are formed in the shape of a dipole antenna. In order to reduce line-switching losses by lowering the wiring resistance of the line-switching conductor patterns 7*a* through 8*b*, the joint portions of the conductive patterns 7*a* through 8*b* with the ground conductors 5*a* and 5*b* are formed to be gradually narrowed, as indicated by R in FIG. 1A, as they advance from the ground conductors 5*a* and 5*b* to the conductor patterns 7*a* through 8*b*. Reference numeral 11 indicates a field-effect transistor (FET) which is mounted at the center of the slot line 6 in such a manner that it bridges over the slot line 6. Notched patterns having a predetermined length in a direction perpendicular to the slot line 6 are formed between the FET 11 and the conductor patterns 7*a* and 8*b*, respectively, so as to form λ/4 short stubs 14 and 15. The λ/4 short stubs 14 and 15 serve to provide impedance matching between FET 11 and the line-switching conductor patterns 7*a* and 8*b*, respectively. Moreover, a gate terminal 12 and a drain terminal 13 are withdrawn to the exterior of the dielectric strips 3*a* and 3*b* from the position at which the FET's terminals are connected.

Figure 2A:
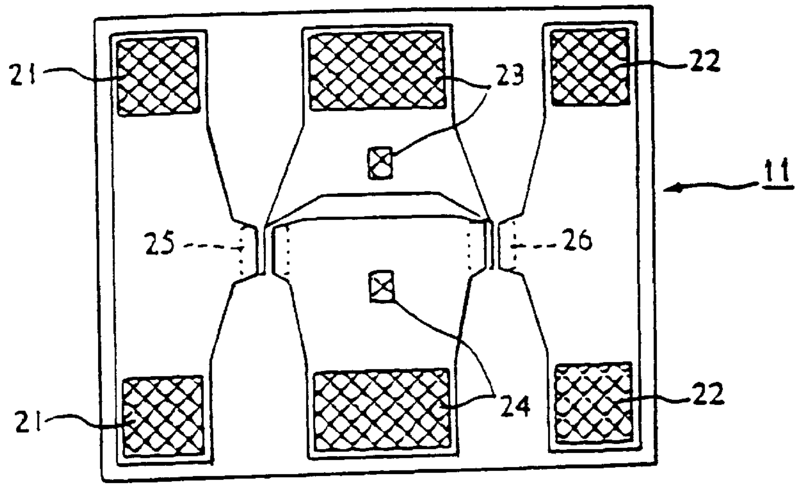
FIG. 2, which is comprised of FIGS. 2A and 2B, illustrates the configuration of a field-effect transistor (FET) and a dielectric plate on which the FET is mounted.
Figure 2B:
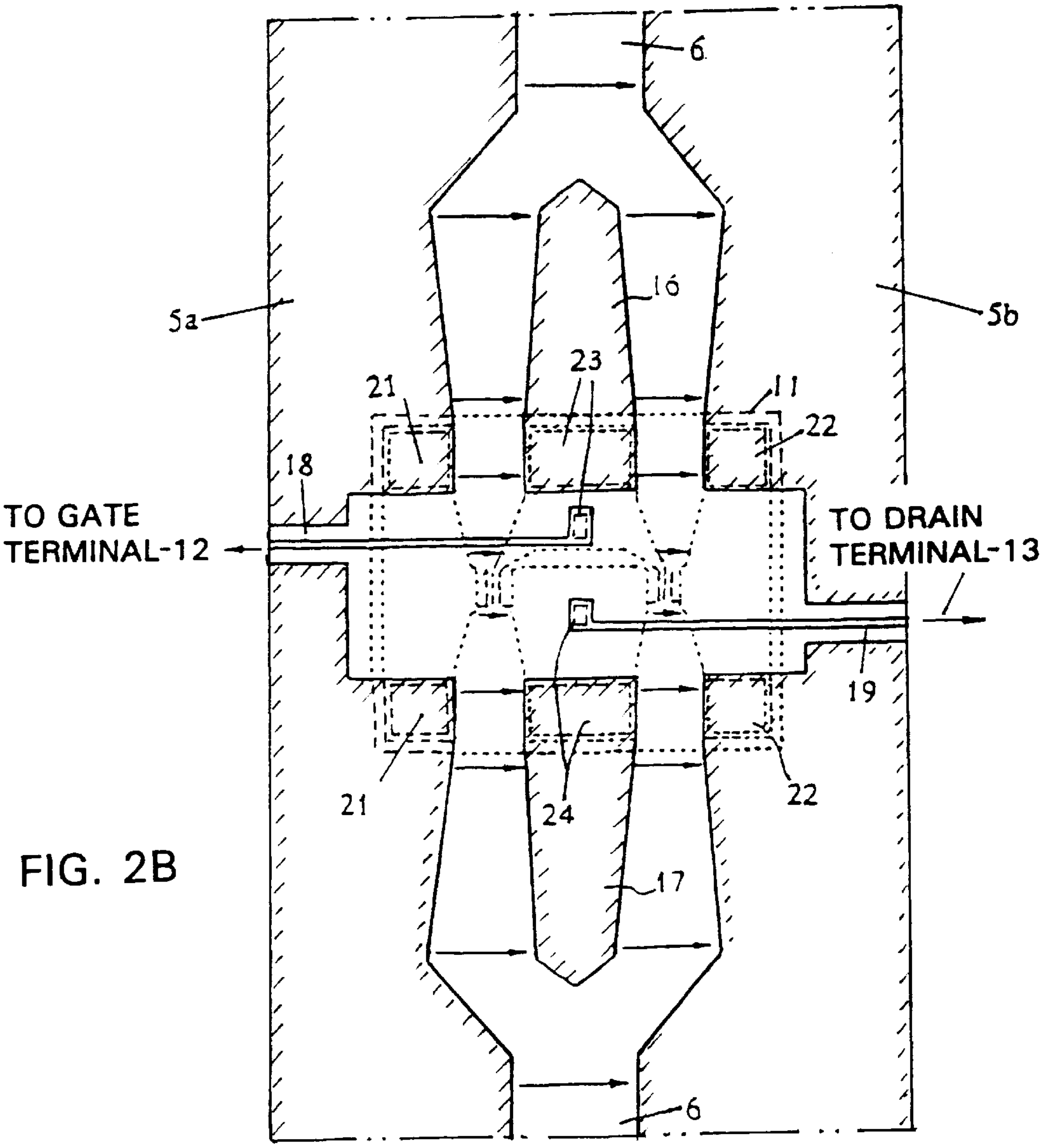

FIG. 2 illustrates the configuration of the FET 11 shown in FIG. 1 and its mounting area: FIG. 2A is a plan view of the FET 11; and FIG. 2B is a plan view of the dielectric plate 4 on which the FET 11 is mounted. The FET 11 has, as shown in FIG. 2A, active layers 25 and 26 where metal semiconductor field-effect transistors (MES-FET) are formed, and source terminals 21 and 22, a gate terminal 23, and a drain terminal 24 are withdrawn from the MES-FETs. Cross-hatching portions shown in FIG. 2A designate via-holes through which the respective terminals are led to the reverse surface of the chip. Reference numerals 16 and 17 shown in FIG. 2B respectively indicate a gate connecting conductor and a drain connecting conductor, both of which are used to branch the slot line 6, formed between the ground conductors 5*a* and 5*b*, into two portions, and also to couple the gate terminal 23 and the drain terminal 24, respectively, with the slot line 6. A gate bias voltage and a drain voltage are respectively applied to the gate terminal 12 and the drain terminal 13 on the dielectric plate 4 shown in FIG. 1A, so that the FET 11 forms a complementary amplifying circuit. The arrows shown in FIG. 2B designate the electromagnetic-field distribution of a signal propagating in the slot line 6. A longitudinal section magnetic (LSM)-mode signal, which propagates in the dielectric line waveguide in a direction from upward to downward as viewed from FIG. 2, is converted into a transverse electric (TE)-mode signal in the line-switching conductor patterns 7*a* and 7*b* shown in FIG. 1. The TE-mode signal further travels in the slot line 6 and is applied as a voltage signal between the gate terminal 23 and the source terminals 21 and 22 of the FET 11. Then, the TE-mode source-drain voltage signal again propagates in the slot line 6, and is converted into an LSM-mode voltage signal in the line-switching conductor patterns 8*a* and 8*b*. The converted LSM-mode signal further propagates in the dielectric line waveguide.

Figure 3A:
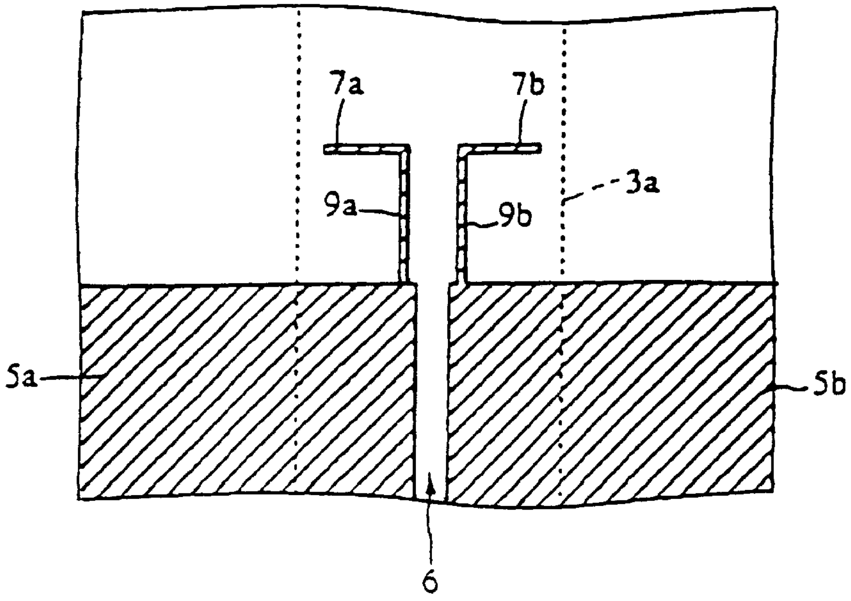
FIG. 3, which is comprised of FIGS. 3A and 3B, illustrates a modification made to the line-switching conductor patterns shown in FIG. 1.
Figure 3B:
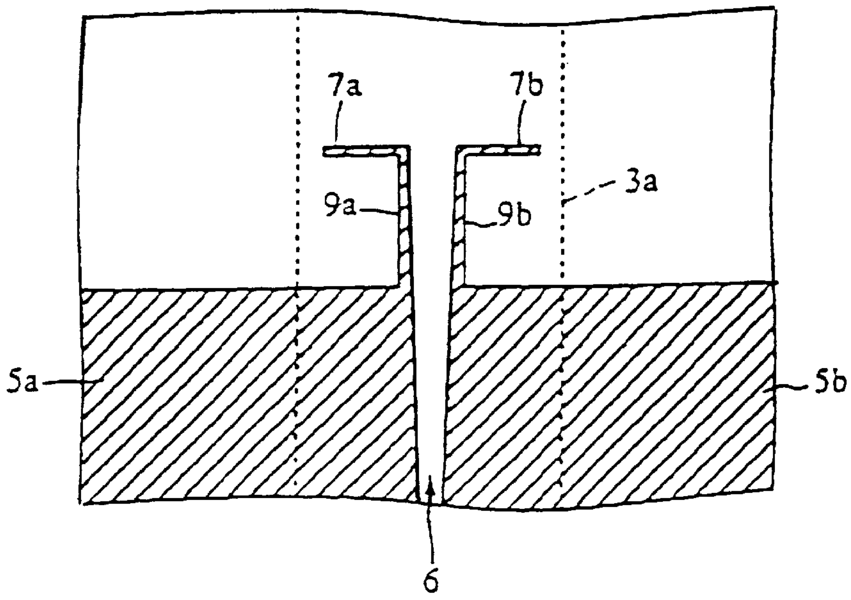

FIG. 3 illustrates another configuration of the line-switching conductor patterns 7*a* and 7*b*. In the example shown in FIG. 3A, λ/4-length slot lines 9*a* and 9*b* having different widths are respectively formed between both sides of the end of the slot line 6 and the line-switching conductor patterns 7*a* and 7*b*. The slot lines 9*a* and 9*b* respectively serve to eliminate the generation of reflection between the conductor patterns 7*a* and 7*b* and the slot line 6, and also to provide impedance matching between the slot line 6 and the dielectric line waveguide and between the slot line 6 and the conductor patterns 7*a* and 7*b*. Further, in the example shown in FIG. 3B, the widths of the slot lines 9*a* and 9*b* having a λ/2 length or longer are gradually changed to provide impedance matching between the slot line 6 and the dielectric line waveguide and between the slot line 6 and the conductor patterns 7a and 7b.

An explanation will now be given with reference to FIG. 4 of the configuration of a dielectric line waveguide provided with a frequency variable portion of a voltage-controlled oscillator (VCO) according to a second embodiment of the present invention.

Figure 4A:
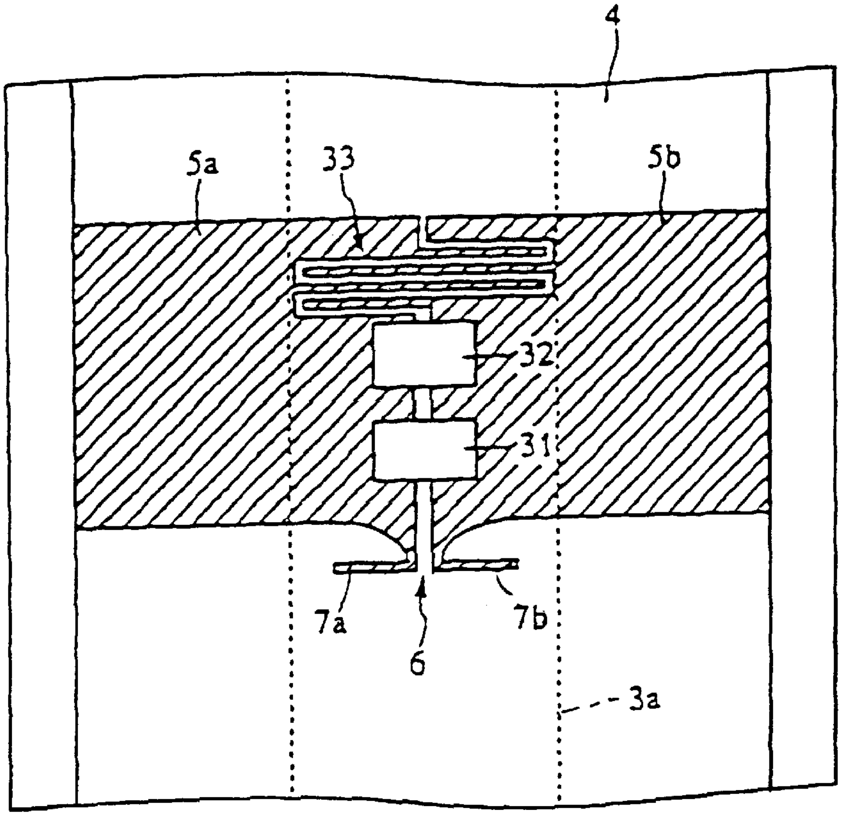
FIG. 4, which is comprised of FIGS. 4A and 4B, illustrates the configuration of a dielectric line waveguide provided with a frequency-variable portion of a voltage-controlled oscillator according to a second embodiment of the present invention.
Figure 4B:
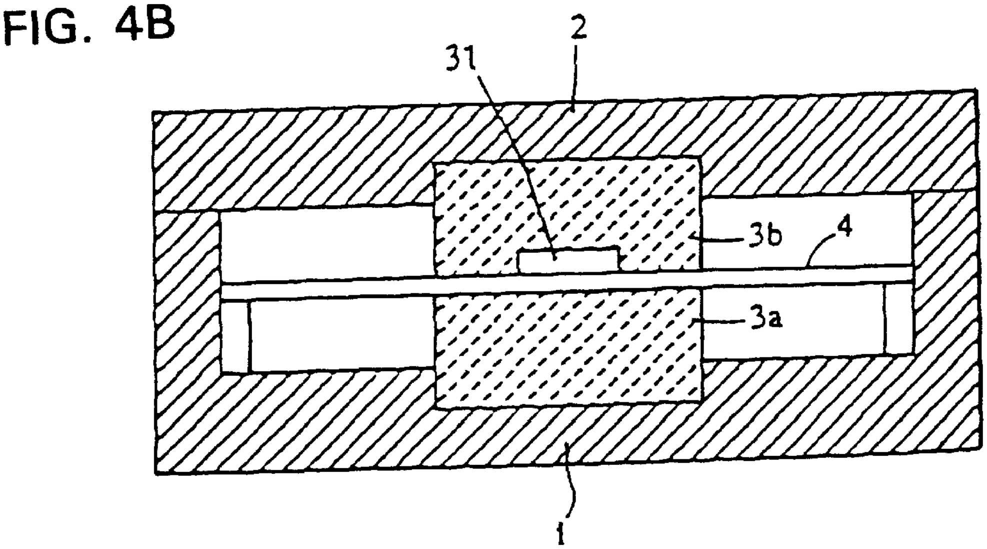

FIG. 4A is a plan view of a dielectric line waveguide from which an upper electrically conductive plate and an upper dielectric strip are removed; FIG. 4B is a sectional view of the dielectric line waveguide shown in FIG. 4A. In the second embodiment, as well as in the first embodiment, two electrically conductive plates 1 and 2, which form two plane parallel conductors, are grooved, as illustrated in FIG. 4B. Then, dielectric strips 3a and 3b are fit into the respective grooves, and a dielectric plate 4 is inserted between the dielectric strips 3a and 3b. A dielectric line waveguide is thus constructed. Formed on the upper surface of the dielectric plate 4 are, as shown in FIG. 4A, ground conductors 5a and 5b having a width which equals an amount required for blocking an RF signal propagating in the dielectric line waveguide. A slot line 6 is formed between the opposing ground conductors 5a and 5b in a direction along the center axis of the dielectric strips 3a and 3b. Disposed at both sides of one end of the slot line 6 are line-switching conductor patterns 7a and 7b, which serve as connecting portions for smoothly guiding a signal propagating in the dielectric strips 3a and 3b to the slot line 6, and which are coupled to electromagnetic fields generated in the dielectric strips 3a and 3b of the dielectric line waveguide and electromagnetic fields generated in the slot line 6. A variable-capacitance diode 31 is mounted on the slot line 6 in such a manner that it bridges over the slot line 6. With this arrangement, a signal, which propagates in the dielectric line waveguide in a direction from downward to upward as viewed from FIG. 4, is coupled to the conductor patterns 7a and 7b and further propagates in the slot line 6. The capacitance of the variable-capacitance diode 31 is changed by a control voltage applied between the ground conductors 5a and 5b. Moreover, a terminating device 32 is mounted rearward (upward in FIG. 4A) of the diode 31, and a DC-blocking circuit 33 formed in a meandering shape is further disposed at the rear of the terminating device 32 so as to narrow the slot width between the ground conductors 5a and 5b and lengthen the opposing distance therebetween. Accordingly, an RF signal propagating in the slot line 6 is terminated by the terminating device 32 and the DC-blocking circuit 33. Conversely, an RF signal propagating in the dielectric line waveguide is interrupted in the ground conductors 5a and 5b. The meandering DC-blocking circuit 33, which intimately couples with the dielectric line waveguide, effectively interrupts an RF signal propagating in the dielectric line waveguide. The DC-blocking circuit 33 may be combined with an oscillator circuit to construct voltage-controlled oscillator circuitry. To achieve this modification, the following configuration of an oscillator circuit may be considered by way of example. In a manner similar to the dielectric line waveguide shown in FIG. 4A, ground conductors and a slot line are disposed on the upper surface of a dielectric plate, and line-switching conductor patterns, which are coupled with electromagnetic fields generated in the dielectric strips of the dielectric line waveguide and electromagnetic fields generated in the slot line, are formed at both sides of one end of the slot line. Further, an oscillation diode is mounted on the slot line in such a manner that it bridges over the slot line.

In this manner, the mode of the dielectric line waveguide having a comparatively high characteristic impedance is converted into a mode of the slot line having a characteristic impedance (100 to 200 Ω) which is akin to the impedance of a variable-capacitance diode. This increases the impedance-variable range of the variable-capacitance diode 31, thereby widening the frequency-variable range.

Although in the embodiment shown in FIG. 4 both of the terminating device 32 and the DC-blocking circuit 33 are disposed, only one of the elements may be sufficiently provided.

The configuration of a dielectric line waveguide including a mixer circuit according to a third embodiment of the present invention will now be described while referring to FIGS. 5 through 7.

Figure 5A:
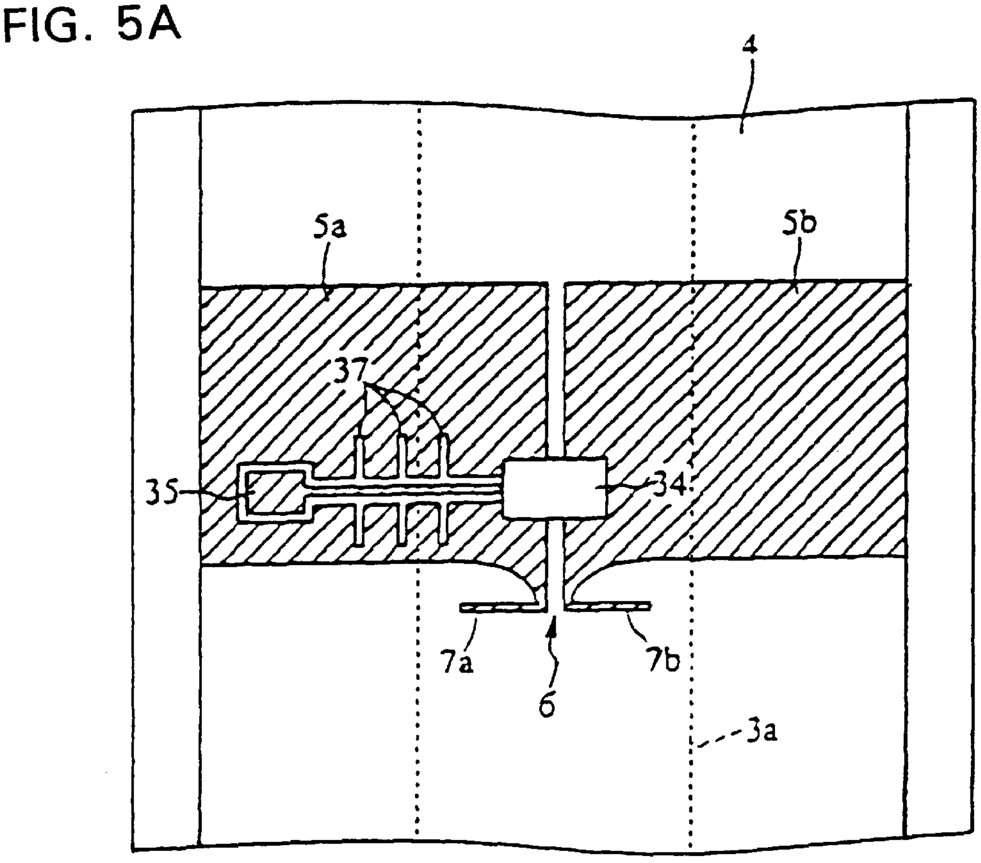
FIG. 5, which is comprised of FIGS. 5A and 5B, illustrates the configuration of a dielectric line waveguide provided with a mixer circuit according to a third embodiment of the present invention.
Figure 5B:
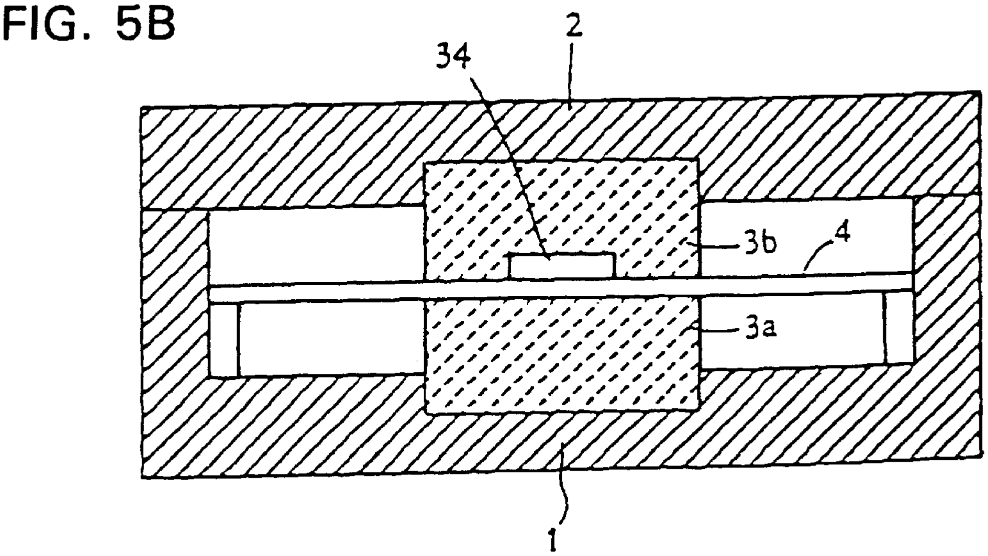

FIG. 5A is a plan view of a dielectric line waveguide from which an upper conductor plate and an upper electrically dielectric strip are removed; and FIG. 5B is a sectional view of the dielectric line waveguide shown in FIG. 5A. The third embodiment is similar to the first embodiment in the following configuration of a dielectric line waveguide. Two electrically conductive plates 1 and 2, which form plane parallel conductors, are grooved. Dielectric strips 3a and 3b are fit into the respective grooves, and a dielectric plate 4 is interposed between the dielectric strips 3a and 3b. Further, in a manner similar to the second embodiment, formed on the upper surface of the dielectric plate 4 are ground conductors 5a and 5b having a width which equals an amount required for interrupting an RF signal propagating in the dielectric line waveguide. A slot line 6 is interposed between the opposing ground conductors 5a and 5b in a direction along the center axis of the dielectric strips 3a and 3b. Moreover, disposed at the both sides of one end of the slot line 6 are line-switching conductor patterns 7a and 7b, which serve as connecting portions for smoothly guiding a signal propagating in the dielectric strips 3a and 3b to the slot line 6, and which are coupled to electromagnetic fields generated in the dielectric strips 3a and 3b of the dielectric line waveguide and electromagnetic fields generated in the slot line 6. Unlike the first and second embodiments, a mixer diode 34 is mounted on the slot line 6 in such a manner that it bridges over the slot line 6. An intermediate frequency (IF) terminal 35 is led from the position at which the anode terminal of the mixer diode 34 is connected. The ground conductor 5a and the leading portion for connecting the mixer diode 34 and the IF terminal 35 form, not only a coplanar line, but also an RF choke 37.

Figure 6A:
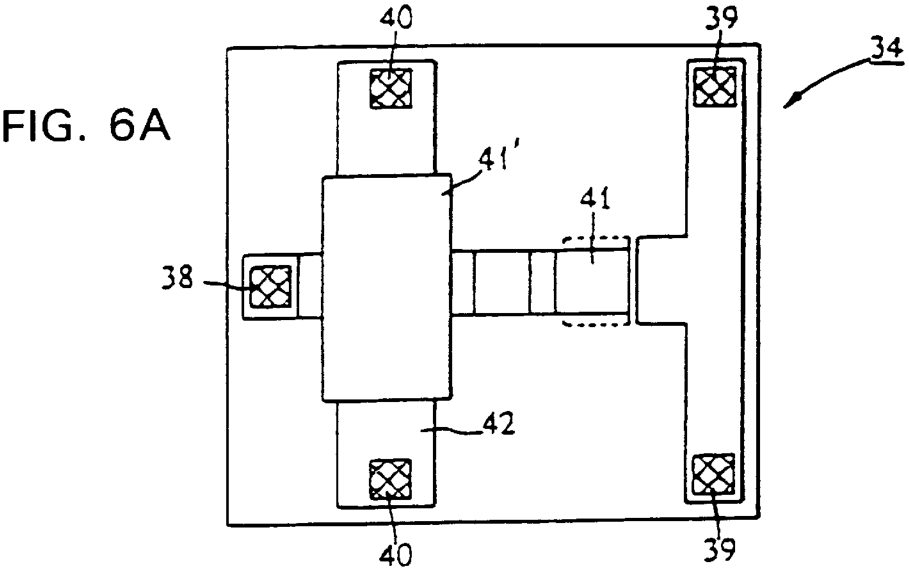
FIG. 6, which is comprised of FIGS. 6A and 6B, illustrates the configuration of the mixer diode shown in FIG. 5.
Figure 6B:
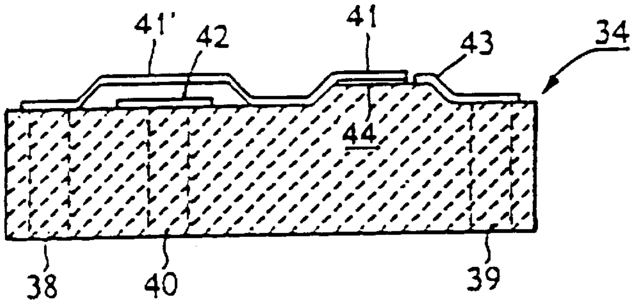

FIG. 6 illustrates the configuration of the mixer diode 34 shown in FIG. 5. A Schottky-barrier junction layer 44 is formed under an anode electrode 41, and an anode terminal 38 and cathode terminals 39 are withdrawn from the Schottky-barrier junction layer 44. Moreover, capacitor electrodes 41' and 42 are provided to withdraw capacitive-coupling terminals 40. Cross-hatching portions shown in FIG. 6A represent via-holes through which the elements of the diode 34 are connected to the respective electrodes mounted on the dielectric plate 4 on the reverse surface of the chip.

Figure 7:
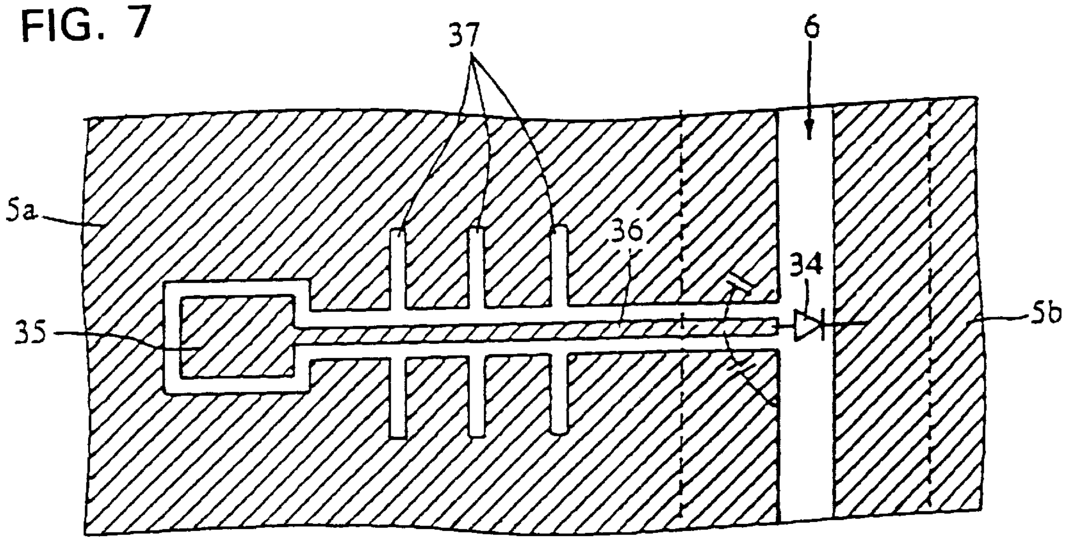
FIG. 7 illustrates the connecting relationship between the mixer diode and the pattern formed on the dielectric plate.

FIG. 7 is a plan view illustrating part of the dielectric plate 4 on which the mixer diode 34 is mounted. The anode terminal 38 is connected to an IF terminal line 36; the capacitive-coupling terminals 40 are connected to the ground conductor 5a; and the cathode terminals 39 are coupled to the ground conductor 5b. Accordingly, a signal (a mixed signal of an RF signal and a local (LO) signal) propagating in the slot line 6 is applied between the anode and cathode electrodes of the mixer diode 34 via capacitance generated by the capacitor electrodes 41' and 42 so as to extract a $|f_{RF}-f_{LO}|$ IF signal from the IF terminal 35.

According to the above description, since the RF signal and the LO signal are frequency-converted within the dielectric line waveguide, conversion losses can be reduced. Moreover, since an IF signal is output from a coplanar line, connection with another microwave circuit can be easily performed.

Figure 8A:
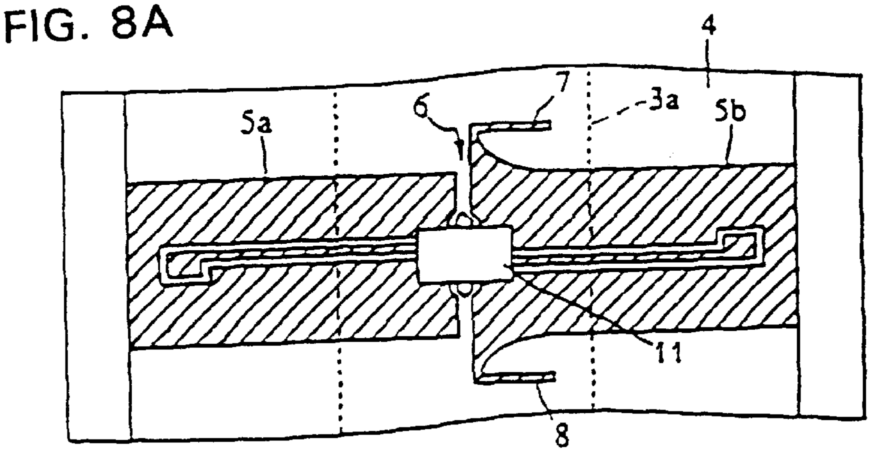
FIG. 8, which is comprised of FIGS. 8A, 8B and 8C, illustrates modifications made to the line-switching conductor patterns.
Figure 8B:
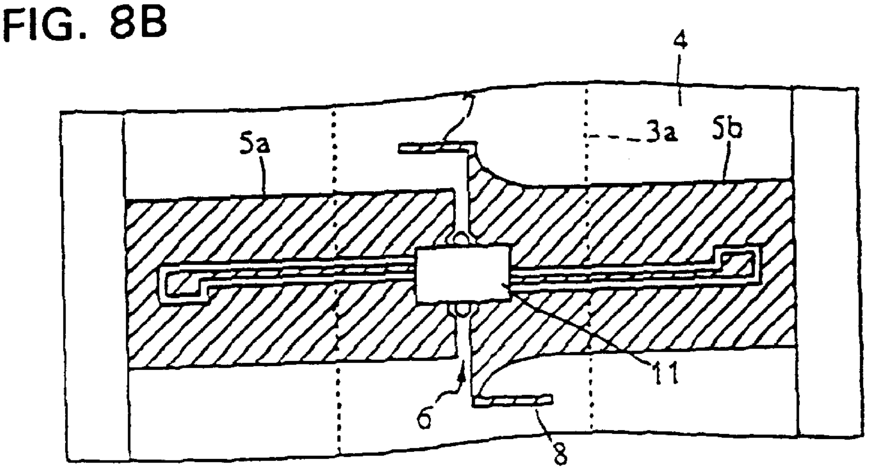
Figure 8C:
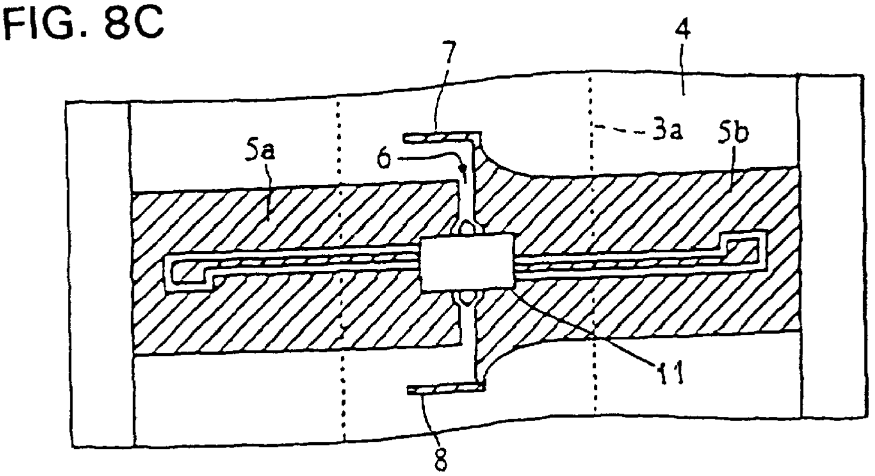

In the foregoing embodiments, the line-switching conductor patterns formed in the shape of a dipole antenna are provided at both sides of at least one end of the slot line; however, a line-switching conductorpattern may be provided, as shown in FIG. 8, for a ground conductor located only one side of each end of the slot line. The example shown in FIG. 8 is a modification made to the dielectric line waveguide including an amplifying circuit stated in the first embodiment, and line-switching conductor patterns 7 and 8 are formed only on the side of the ground conductor 5*b*.

As is seen from the above description, the dielectric line waveguide of the present invention offers the following advantages.

A circuit formed of a semiconductor device is formed on the dielectric plate at a position corresponding to the inside of the dielectric strip. This eliminates the generation of parasitic coupling between the dielectric line waveguide and an external circuit, which would otherwise be caused if an external circuit is provided. Also, transmission losses generated at a connecting portion between the dielectric strip and the semiconductor device can be inhibited to a minimal level. Moreover, it is possible to fabricate the ground conductor and the line-switching conductor pattern on the dielectric plate according to a technique similar to the typical manufacturing method for a printed wiring board. The manufacturing cost can thus be reduced.

Moreover, a frequency signal (RF signal) propagating in the dielectric line waveguide is interrupted in and by the action of the ground conductor disposed on the dielectric plate. Accordingly, two dielectric lines are formed in a continuous dielectric strip, and are connected to each other via the semiconductor device. It is thus possible to readily construct a dielectric line waveguide provided with an amplifying circuit by using, for example, a FET.

The impedance matching can be provided between the line-switching conductor pattern and the semiconductor device, thereby inhibiting transmission losses at a connecting portion between the slot line and the semiconductor device.

Further, the impedance matching can be provided between the slot line and the line-switching conductor pattern and between the slot line and the dielectric line waveguide. It is thus possible to suppress unwanted reflection, and inhibit transmission losses incident to a line-switching operation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A dielectric line waveguide comprising:

two electrically conductive plates disposed substantially parallel to each other;

a first dielectric strip disposed between said two electrically conductive plates;

a dielectric plate disposed between said two electrically conductive plates;

a ground conductor formed on said dielectric plate and having an area which equals an amount required for blocking a frequency signal propagating in said dielectric line waveguide, said ground conductor having a slot line at a position intermediate opposed sides of said first dielectric strip;

a first line-switching conductor pattern provided for said ground conductor at a position corresponding to an end of said slot line, said conductor pattern being coupled to electromagnetic fields generated in said slot line and in said dielectric strip; and a semiconductor device disposed on said slot line in such a manner that it bridges over said slot line.

2. A dielectric line waveguide according to claim 1, wherein a second line-switching conductor pattern is provided at an opposite end of said slot line, and wherein said semiconductor device is disposed substantially at the center of said slot line.

3. A dielectric line waveguide according to claim 1, wherein a λ/4 short stub used for providing impedance matching between said line-switching conductor pattern and said semiconductor device is provided in said slot line.

4. A dielectric line waveguide according to claim 2, wherein a λ/4 short stub used for providing impedance matching between said line-switching conductor pattern and said semiconductor device is provided in said slot line.

5. A dielectric line waveguide according to claim 1, wherein an impedance matching circuit is provided between said first line-switching conductor pattern and said slot line.

6. A dielectric line waveguide according to claim 2, wherein an impedance matching circuit is provided between said first line-switching conductor pattern and said slot line.

7. A dielectric line waveguide according to claim 3, wherein an impedance matching circuit is provided between said first line-switching conductor pattern and said slot line.

8. A dielectric line waveguide according to claim 4, wherein an impedance matching circuit is provided between said first line-switching conductor pattern and said slot line.

9. A dielectric line waveguide according to claim 1, further comprising a second dielectric strip, said first dielectric strip being on one side of said dielectric plate and said second dielectric strip being on an opposite side of said dielectric plate.

10. A dielectric line waveguide according to claim 9, wherein said first and second dielectric strips have respective center axes aligned with each other and said slot is located at a position aligned with said center axes.

11. A dielectric line waveguide according to claim 2, wherein each of said line-switching conductor patterns includes a dipole antenna.

12. A dielectric line waveguide according to claim 11, wherein each of said line switching conductor patterns includes an additional slot line having a length of λ/4.

13. A dielectric line waveguide according to claim 11, wherein each of said line switching conductor patterns includes an additional slot line having a length of at least λ/2 and a varying width.

14. A dielectric line waveguide according to claim 1, wherein said semiconductor device is an FET.

15. A dielectric line waveguide according to claim 1, wherein said semiconductor device is a variable capacitance diode.

16. A dielectric line waveguide according to claim 15, further comprising a meandering pattern constituting a DC blocking circuit formed in said ground plain adjacent to said slot line.

17. A dielectric line waveguide according to claim 16, further including a terminating circuit disposed on said slot line in such a manner that it bridges over said slot line.

18. A dielectric line waveguide according to claim 1, wherein said semiconductor device is a mixer diode.

19. A dielectric line waveguide according to claim 18, wherein said ground plain includes an IF terminal and an RF choke.

* * * * *